(12) United States Patent
Epstein et al.

(10) Patent No.: US 9,940,586 B1
(45) Date of Patent: Apr. 10, 2018

(54) ENCODING TWO-QUBIT INTERACTIONS

(71) Applicants: Ryan J. Epstein, Denver, CO (US); David George Ferguson, Takoma Park, MD (US)

(72) Inventors: Ryan J. Epstein, Denver, CO (US); David George Ferguson, Takoma Park, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/659,061

(22) Filed: Jul. 25, 2017

(51) Int. Cl.
*G06N 99/00* (2010.01)
*H03K 19/195* (2006.01)
*H01L 39/22* (2006.01)

(52) U.S. Cl.
CPC ......... *G06N 99/002* (2013.01); *H01L 39/223* (2013.01); *H03K 19/195* (2013.01)

(58) Field of Classification Search
CPC ...... G06N 99/002; B82Y 10/00; B82Y 15/00; B82Y 40/00; H03K 19/195; H03K 19/0002; H03K 3/38; H01L 39/025; H01L 27/18; H01L 29/437; H01L 29/66977; H01L 39/223; H01L 39/2493; G02F 2001/01791; G02F 11/10; G02F 11/1048; H04L 2209/34; H04L 9/0852; H04L 9/0858

See application file for complete search history.

(56) References Cited

U.S. PATENT DOCUMENTS

| | | | | | |
|---|---|---|---|---|---|
| 7,836,007 | B2 * | 11/2010 | Beausoleil | ........... | G06N 99/002 706/62 |
| 8,897,057 | B2 * | 11/2014 | Skold | ...................... | G11C 11/14 365/129 |
| 8,957,699 | B2 * | 2/2015 | Eastin | .................. | G06N 99/002 326/7 |
| 9,160,341 | B2 * | 10/2015 | Eastin | .................. | H03K 19/195 |
| 9,269,052 | B2 * | 2/2016 | Svore | .................. | G06N 99/002 |
| 9,633,313 | B2 * | 4/2017 | Svore | .................. | G06N 99/002 |
| 9,748,976 | B2 * | 8/2017 | Naaman | ............ | H03M 13/1575 |
| 9,773,208 | B2 * | 9/2017 | Betz | ....................... | G06N 99/002 |
| 9,829,557 | B2 * | 11/2017 | Walsworth | ............. | G01R 33/58 |
| 2017/0116542 | A1 * | 4/2017 | Shim | ..................... | G06N 99/002 |

* cited by examiner

*Primary Examiner* — Vibol Tan
(74) *Attorney, Agent, or Firm* — Tarolli, Sundheim, Covell & Tummino LLP

(57) ABSTRACT

Systems and methods are provided for encoding two-qubit interactions. A quantum circuit comprises first and second logical qubits, each comprising a Bacon-Shor code block. A first edge of each logical qubit contains physical qubits each coupled to at least one neighboring physical qubit along the first edge along a first axis of the Bloch sphere and a second edge of each logical qubit contains physical qubits each coupled to at least one neighboring physical qubit along the second edge along a second axis of the Bloch sphere. A set of couplers couple the first and second logical qubits along the first axis of the Bloch sphere, with each of the set of couplers coupling a physical qubit along the second edge of the first logical qubit to a corresponding physical qubit along the second edge of the second logical qubit along the first axis of the Bloch sphere.

20 Claims, 3 Drawing Sheets

ENCODING TWO-QUBIT INTERACTIONS

TECHNICAL FIELD

This invention relates to quantum computing, and more particularly, systems and methods for encoding two-qubit interactions.

BACKGROUND

A classical computer operates by processing binary bits of information that change state according to the laws of classical physics. These information bits can be modified by using simple logic gates such as AND and OR gates. The binary bits are physically created by a high or a low signal level occurring at the output of the logic gate to represent either a logical one (e.g., high voltage) or a logical zero (e.g., low voltage). A classical algorithm, such as one that multiplies two integers, can be decomposed into a long string of these simple logic gates. Like a classical computer, a quantum computer also has bits and gates. Instead of using logical ones and zeroes, a quantum bit ("qubit") uses quantum mechanics to occupy both possibilities simultaneously. This ability and other uniquely quantum mechanical features enable a quantum computer can solve certain problems exponentially faster than that of a classical computer.

Quantum annealing starts from a quantum-mechanical superposition of all possible states, referred to as candidate states) with equal weights. The system evolves following the time-dependent Schrödinger equation, a natural quantum-mechanical evolution of physical systems. The amplitudes of all candidate states keep changing, realizing a quantum parallelism, according to the time-dependent strength of the transverse field, which causes quantum tunneling between states. If the rate of change of the transverse-field is slow enough, the system stays close to the ground state of the instantaneous Hamiltonian. If the rate of change of the transverse-field is accelerated, the system may leave the ground state temporarily but produce a higher likelihood of concluding in the ground state of the final problem Hamiltonian. The transverse field is switched off, and the system is expected to have reached the ground state or otherwise computationally useful state of the classical lsing model that corresponds to a solution or approximate solution to the original optimization problem.

SUMMARY OF THE INVENTION

In accordance with an aspect of the present invention, a quantum circuit comprises first and second logical qubits, each comprising a Bacon-Shor code block comprising a plurality of physical qubits coupled in an array. A first edge of each logical qubit contains physical qubits each coupled to at least one neighboring physical qubit along the first edge along a first axis of the Bloch sphere and a second edge of each logical qubit contains physical qubits each coupled to at least one neighboring physical qubit along the second edge along a second axis of the Bloch sphere. A set of couplers couple the first and second logical qubits along the first axis of the Bloch sphere, with each of the set of couplers coupling a physical qubit along the second edge of the first logical qubit to a corresponding physical qubit along the second edge of the second logical qubit along the first axis of the Bloch sphere.

In accordance with another aspect of the present invention, a method is provided for constructing a quantum circuit. A first logical qubit is fabricated as a first Bacon-Shor code block. The first logical qubit includes at least a first physical qubit, a second physical qubit coupled to the first physical qubit along a first axis of the Bloch sphere, and a third physical qubit coupled to the first physical qubit along a second axis of the Bloch sphere. A second logical qubit is fabricated as a second Bacon-Shor code block. The second logical qubit includes at least a fourth physical qubit, a fifth physical qubit coupled to the fourth physical qubit along the first axis of the Bloch sphere, and a sixth physical qubit coupled to the fourth physical qubit along the second axis of the Bloch sphere. The first physical qubit is coupled to the fourth physical qubit along the first axis of the Bloch sphere with a first coupler. The third physical qubit is coupled to the sixth physical qubit along the first axis of the Bloch sphere with a second coupler.

In accordance with yet another aspect of the present invention, a first logical qubit includes at least a first physical qubit, a second physical qubit coupled to the first physical qubit along a first axis of the Bloch sphere, and a third physical qubit coupled to the first physical qubit along a second axis of the Bloch sphere. A second logical qubit includes at least a fourth physical qubit, a fifth physical qubit coupled to the fourth physical qubit along the first axis of the Bloch sphere, and a sixth physical qubit coupled to the fourth physical qubit along the second axis of the Bloch sphere. A third logical qubit includes at least a seventh physical qubit, an eighth physical qubit coupled to the seventh physical qubit along the first axis of the Bloch sphere, and a ninth physical qubit coupled to the seventh physical qubit along the second axis of the Bloch sphere. A first coupler couples the first physical qubit to the fourth physical qubit along the first axis of the Bloch sphere. A second coupler couples the third physical qubit to the sixth physical qubit along the first axis of the Bloch sphere. A third coupler couples the first physical qubit to the seventh physical qubit along the second axis of the Bloch sphere. A fourth coupler couples the second physical qubit to the eighth physical qubit along the second axis of the Bloch sphere.

DETAILED DESCRIPTION

Figure 1:
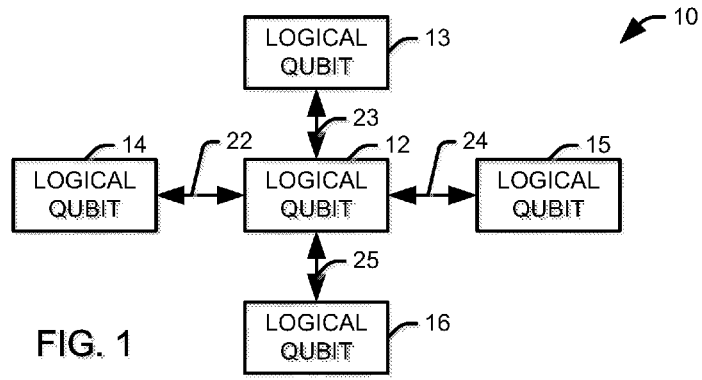
FIG. 1 illustrates one example of a system comprising five Bacon-Shor logical qubits coupled by respective couplers.

The systems and methods described herein is intended for use in a quantum computing environment, in which information is stored and manipulated in qubits, including any qubit for which two or more of XX, YY, and ZZ couplings can be implemented. A physical implementation of a qubit can be a Josephson junction, a quantum dot, a SQUID (superconducting quantum interference device), a Cooper pair box, or an ion trap. Further, unless specified, the coupling of two elements may be accomplished according to the invention using any of various means of physical coupling, for example, a mechanical coupling by means of an electrical conductor, capacitive coupling, inductive coupling, magnetic coupling, nuclear coupling, and optical coupling, or any combination of the foregoing. As used herein, a "classical control" indicates a device that behaves generally according to the laws of classical physics that provides a control signal to a quantum element, such as a qubit or coupler.

The systems and methods utilize coupling between pairs of superconducting qubits. An XX, YY, or ZZ coupling between two qubits makes it energetically favorable for the states of the first and second qubits to assume a specific relationship with respect to the appropriate axis, corresponding to a specific quantum state defined on the Bloch sphere of the qubit. It will be appreciated that the coupling can be positive or negative, with a negative coupling making it energetically favorable for the states of the first and second qubits to align in the same direction along the axis, and a positive coupling making it energetically favorable for the states of the first and second qubits to align in different directions along the axis.

The systems and methods described herein provide encoded two-qubit interactions, which enables noise suppression of coupled encoded qubits during a quantum annealing process. The scheme uses Bacon-Shor Hamiltonian encoding, also known as the quantum compass model, which provides a means of creating a logical qubit, comprising multiple coupled physical qubits, that is protected to some degree from noise acting on the individual qubits. Bacon-Shor codes are quantum subsystem codes which are well suited for applications to fault-tolerant quantum memory, because error syndrome information can be extracted by measuring only two-qubit operators that are spatially local if the qubits are arranged in a two-dimensional lattice.

A unique aspect of the Bacon-Shor encoding is that only two-qubit interactions are required instead of higher weight interactions such as the four qubit interations that are necessary for the surface code. This is advantageous since two-qubit superconducting couplers are more mature than higher weight couplers and typically achieve higher interaction strengths. The degree of error suppression of the Bacon-Shor encoding is proportional to $r_{nc}^m$ where m is the linear size of the code block and $r_{nc}$ is the ratio of noise to coupling strength. It will be appreciated that the noise suppression provided by the code block increases with the strength of the coupling.

FIG. 1 illustrates one example of a system 10 comprising five Bacon-Shor logical qubits 12-16 coupled by respective couplers 22-25. As used herein, a Bacon-Shor logical qubit is an array of qubits in which each qubit is coupled to at least two neighboring qubits to form an array. Each qubit is coupled on a first axis of the Bloch sphere with a first set of at least one neighbor and is coupled on a second axis of the Bloch sphere with a second set of at least one neighbor. The couplings are aligned by direction, so neighbors in a first direction (e.g., horizontal neighbors) are coupled along a first axis of the Bloch sphere and neighbors in a second direction (e.g., vertical neighbors) are coupled along a second axis of the Bloch sphere. The resulting array stores a logical qubit, that is an item of quantum information.

The inventors have determined that the logical qubits 12-16 can be coupled to one another via an edge coupling process in which the qubits along one edge of a first block are coupled in a one-to-one correspondence with qubits along an edge of a second block. Accordingly, each coupler 22-25 represents a plurality of individual qubit-to-qubit couplings. Each qubit has internal couplings to qubits within a code block as well as couplings to qubits external to a code block. It will be appreciated that, given the directional alignment of the couplings in a given Bacon-Shor logical qubit, the physical qubits along a given edge of the logical qubit, will have couplers associated with only one of the two axes of the Bloch sphere associated with the logical qubit. In one implementation, each pair of qubits coupled in the couplers 22-25 are coupled, such that for a coupling between logical qubits along one axis of the Bloch sphere, the individual qubits comprising the edges of the coupled logical qubits are coupled to one another along the other axis of the Bloch sphere associated with the logical qubit. In other words, the internal connections along the edge are along axis different from the axis of the external coupling. Accordingly, for a ZZ coupling between two logical qubits, the physical qubits along the coupled edges of each qubit will be coupled to one another with XX couplers within the logical qubit and with ZZ couplers to the qubits in the other logical qubit.

The couplers 22-25 can be selected to be tunable, such that a coupling strength and sign (e.g., positive or negative) can be tuned via a control signal provided by an associated classical control. In one implementation, the couplers 22-25 can be controlled via applied fluxes having a magnitude selectable via the classical control. While the individual couplers are controlled in concert, it will be appreciated that the classical control for each coupler can provide non-identical control signals to each coupler (e.g., different amounts of flux) to account for variations in the fabrication of each coupler.

Figure 2:
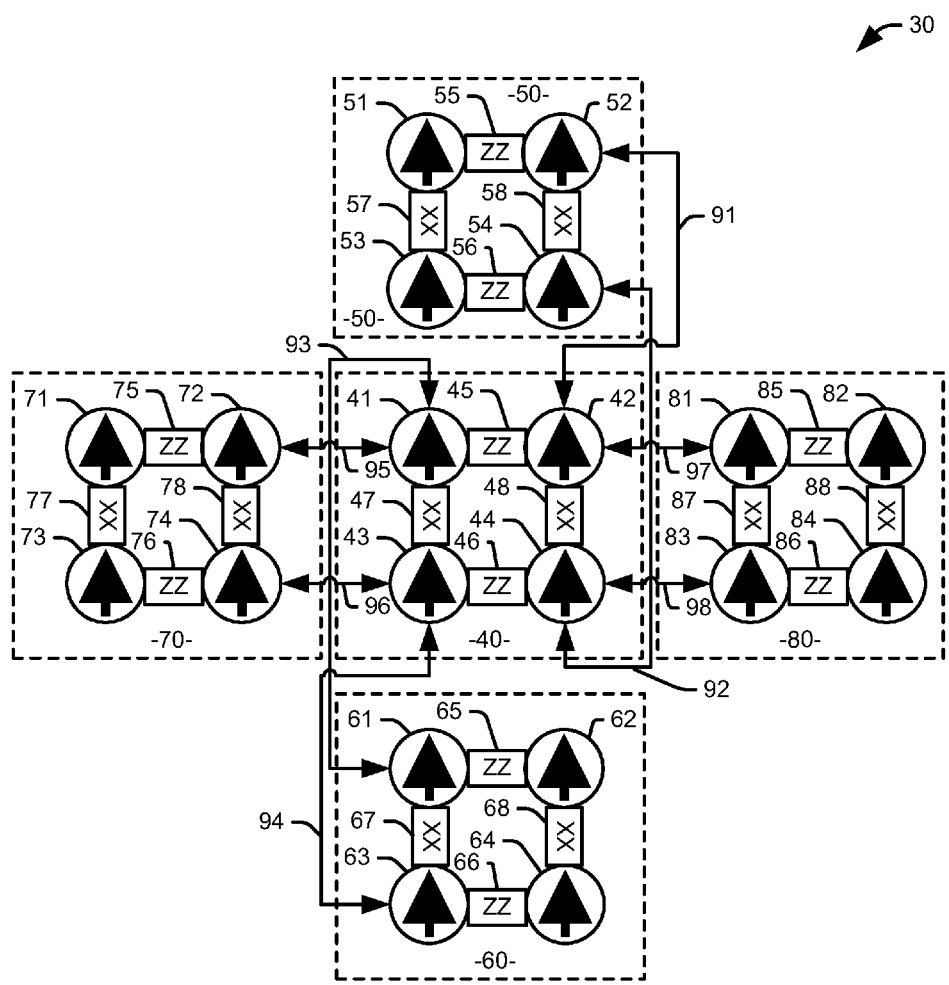
FIG. 2 illustrates one implementation of a quantum circuit comprising five logical qubits.

FIG. 2 illustrates one implementation of a quantum circuit 30 comprising five logical qubits 40, 50, 60, 70, and 80. A first logical qubit 40 is coupled to each other logical qubit 50, 60, 70, and 80 along a Z-axis of the Bloch sphere via a plurality of tunable ZZ couplers 91-98. It will be appreciated that this arrangement is provided only for the purpose of example, and that other arrangements of logical qubits are envisioned using the edge coupling technique described herein.

A first logical qubit 40 comprises four physical qubits 41-44. A first physical qubit 41 is coupled to a second physical qubit 42 via a first ZZ coupler 45. A third physical qubit 43 is coupled to a fourth physical qubit 44 via a second ZZ coupler 46. The first physical qubit 41 is coupled to the third physical qubit 43 via a first XX coupler 47. A second physical qubit 42 is coupled to a fourth physical qubit 44 via a second XX coupler 48. It will be appreciated that the each of the ZZ couplers 45 and 46 and the XX couplers 47 and 48 can have a large, constant coupling strength.

A second logical qubit 50 comprises four physical qubits 51-54. A first physical qubit 51 is coupled to a second physical qubit 52 via a first ZZ coupler 55. A third physical qubit 53 is coupled to a fourth physical qubit 54 via a second ZZ coupler 56. The first physical qubit 51 is coupled to the third physical qubit 53 via a first XX coupler 57. A second physical qubit 52 is coupled to a fourth physical qubit 54 via a second XX coupler 58. It will be appreciated that the each of the ZZ couplers 55 and 56 and the XX couplers 57 and 58 can have a large, constant coupling strength.

A third logical qubit 60 comprises four physical qubits 61-64. A first physical qubit 61 is coupled to a second physical qubit 62 via a first ZZ coupler 65. A third physical qubit 63 is coupled to a fourth physical qubit 64 via a second ZZ coupler 66. The first physical qubit 61 is coupled to the third physical qubit 63 via a first XX coupler 67. A second physical qubit 62 is coupled to a fourth physical qubit 64 via a second XX coupler 68. It will be appreciated that the each of the ZZ couplers 65 and 66 and the XX couplers 67 and 68 can have a large, constant coupling strength.

A fourth logical qubit 70 comprises four physical qubits 71-74. A first physical qubit 71 is coupled to a second physical qubit 72 via a first ZZ coupler 75. A third physical qubit 73 is coupled to a fourth physical qubit 74 via a second ZZ coupler 76. The first physical qubit 71 is coupled to the third physical qubit 73 via a first XX coupler 77. A second physical qubit 72 is coupled to a fourth physical qubit 74 via a second XX coupler 78. It will be appreciated that the each of the ZZ couplers 75 and 76 and the XX couplers 77 and 78 can have a large, constant coupling strength.

A fifth logical qubit 80 comprises four physical qubits 81-84. A first physical qubit 81 is coupled to a second physical qubit 82 via a first ZZ coupler 83. A third physical qubit 83 is coupled to a fourth physical qubit 84 via a second ZZ coupler 86. The first physical qubit 81 is coupled to the third physical qubit 83 via a first XX coupler 87. A second physical qubit 82 is coupled to a fourth physical qubit 84 via a second XX coupler 88. It will be appreciated that the each of the ZZ couplers 85 and 86 and the XX couplers 87 and 88 can have a large, constant coupling strength.

The first logical qubit 40 is edge coupled to each other logical qubit 50, 60, 70, and 80 to provide a tunable ZZ coupling between the qubits. The coupling between each pair of logical qubits takes the form of individual couplings of each physical qubit along an edge of a logical qubit to corresponding physical qubits on an edge of another qubit. Each edge is selected such that the physical qubits along the edge are coupled to neighboring qubits on the edge via XX couplers. Accordingly, the first logical qubit 40 and the second logical qubit 50 are coupled via a first tunable ZZ coupler 91 between their respective second physical qubits 42 and 52 and a second tunable ZZ coupler 92 between their respective fourth physical qubits 44 and 54. It will be appreciated that the second and fourth physical qubits on each logical qubit 40 and 50 are XX coupled.

The first logical qubit 40 and the third logical qubit 60 are coupled via a third tunable ZZ coupler 93 between their respective first physical qubits 41 and 61 and a fourth tunable ZZ coupler 94 between their respective third physical qubits 43 and 63. The first and third physical qubits on each logical qubit 40 and 60 are XX coupled. The first logical qubit 40 and the fourth logical qubit 70 are coupled via a fifth tunable ZZ coupler 95 between the first physical qubit 41 of the first logical qubit and the second physical qubit 72 of the fourth logical qubit and a sixth tunable ZZ coupler 96 between the third physical qubit 43 of the first logical qubit and the fourth physical qubit 74 of the fourth logical qubit. The first logical qubit 40 and the fifth logical qubit 80 are coupled via a seventh tunable ZZ coupler 97 between the second physical qubit 42 of the first logical qubit and the first physical qubit 81 of the fifth logical qubit and an eighth tunable ZZ coupler 98 between the fourth physical qubit 44 of the first logical qubit and the third physical qubit 83 of the fifth logical qubit. It will be appreciated that this structure is merely an example, and that additional couplers and logical qubits could be used to generate a more complex system.

Figure 3:
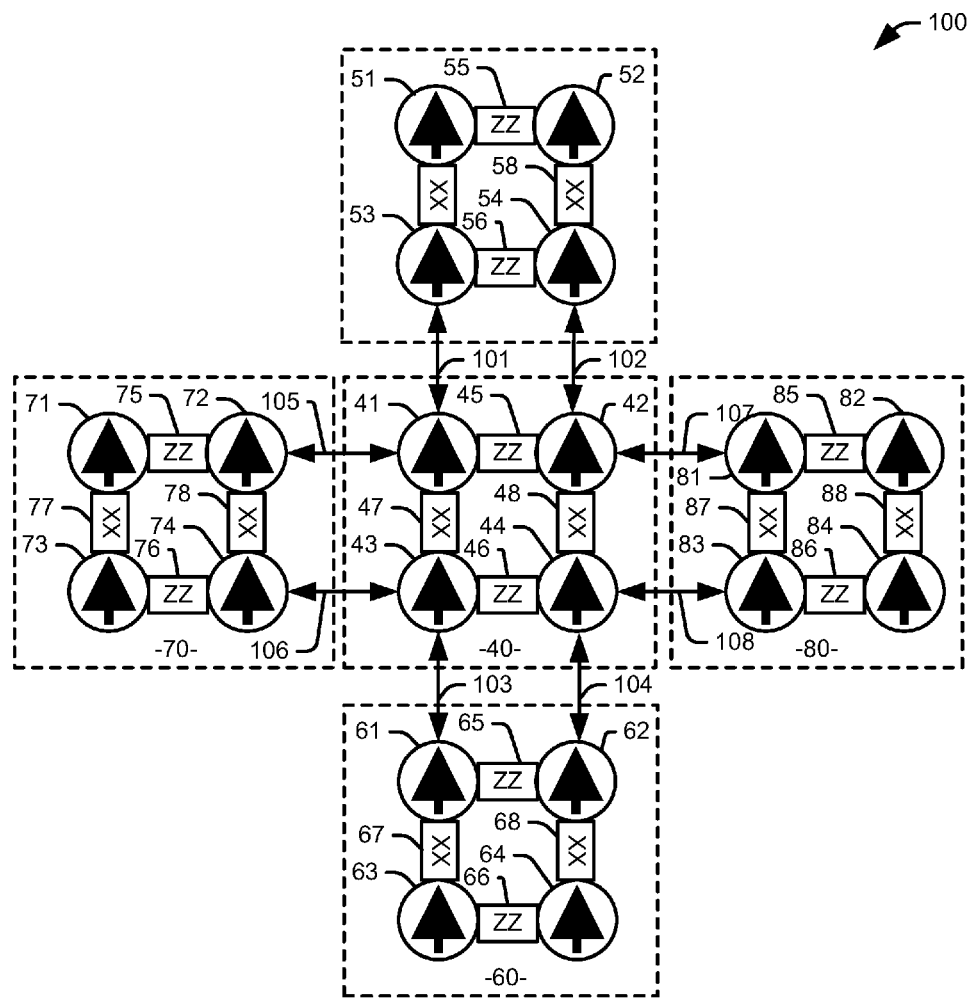
FIG. 3 illustrates another implementation of a quantum circuit comprising five logical qubits.

FIG. 3 illustrates another implementation of a quantum circuit 100 comprising five logical qubits 40, 50, 60, 70, and 80. The logical qubits in this implementation are identical in structure to the logical qubits 40, 50, 60, 70, and 80, as described previously. In this implementation, however, the first logical qubit 40 is coupled to the second and third logical qubits 50 and 60 along an X-axis of the Bloch sphere via a plurality of tunable XX couplers 101-104, and the first logical qubit 40 is coupled to the fourth and fifth logical qubits 70 and 80 along a Z-axis of the Bloch sphere via a plurality of tunable ZZ couplers 105-108. It will be appreciated that this arrangement is provided only for the purpose of example, and that other arrangements of logical qubits are envisioned using the edge coupling technique described herein.

Like the example of FIG. 2, the first logical qubit 40 is edge coupled to each other logical qubit 50, 60, 70, and 80 to provide a tunable coupling between the qubits, with the coupling between each pair of logical qubits takes the form of individual couplings of each physical qubit along an edge of a logical qubit to corresponding physical qubits on an edge of another qubit. For a given one of XX or ZZ coupling of logical qubits, each edge is selected such that the physical qubits along the edge are coupled to neighboring qubits on the edge via an other of XX and ZZ couplers.

As stated previously, the first logical qubit 40 is XX coupled to each of the second logical qubit 50 and the third logical qubit 60. Accordingly, the first logical qubit 40 and the second logical qubit 50 are coupled via a first tunable XX coupler 101 between the first physical qubit 41 of the first logical qubit and the third physical qubit 53 of the second logical qubit and a second tunable XX coupler 102 between the second physical qubit 42 of the first logical qubit and the fourth physical qubit 54 of the second logical qubit. The first logical qubit 40 and the third logical qubit 60 are coupled via a third tunable XX coupler 103 between the third physical qubit 43 of the first logical qubit and the first physical qubit 61 of the third logical qubit and a fourth tunable XX coupler 104 between the fourth physical qubit 44 of the first logical qubit and the second physical qubit 62 of the third logical qubit. It will be appreciated that the first and second physical qubits and the third and fourth physical qubits within each logical qubit 40, 50, and 60 are XX coupled.

The first logical qubit 40 is ZZ coupled to each of the fourth logical qubit 70 and the fifth logical qubit 80. Accordingly, the first logical qubit 40 and the fourth logical qubit 70 are coupled via a fifth tunable ZZ coupler 105 between the first physical qubit 41 of the first logical qubit and the second physical qubit 72 of the fourth logical qubit and a sixth tunable ZZ coupler 106 between the third physical qubit 43 of the first logical qubit and the fourth physical qubit 74 of the fourth logical qubit. The first logical qubit 40 and the fifth logical qubit 80 are coupled via a seventh tunable ZZ coupler 107 between the second physical qubit 42 of the first logical qubit and the first physical qubit 81 of the fifth logical qubit and an eighth tunable ZZ coupler 108 between the fourth physical qubit 44 of the first logical qubit and the third physical qubit 83 of the fifth logical qubit. It will be appreciated that the first and third physical qubits and the second and fourth physical qubits within each logical qubit 40, 70, and 80 are ZZ coupled. Like the circuit of FIG. 2, this structure is merely an example, and that additional couplers and logical qubits could be used to generate a more complex system.

Figure 4:
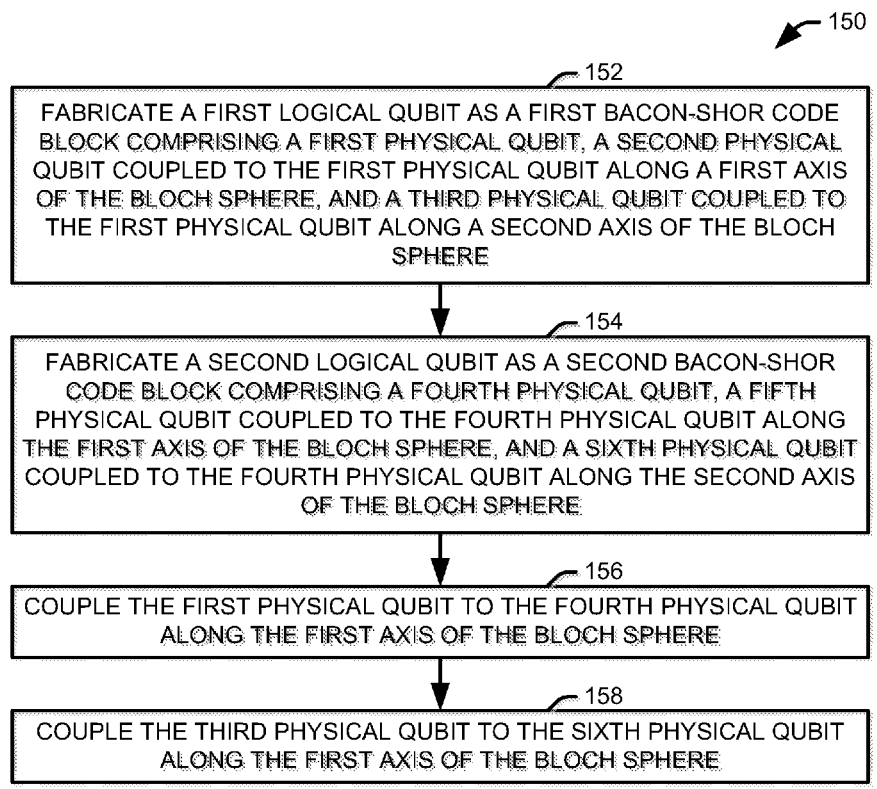
FIG. 4 illustrates a method for constructing a quantum circuit.

In view of the foregoing structural and functional features described above in FIGS. 1-3, an example method will be better appreciated with reference to FIG. 4. While, for purposes of simplicity of explanation, the method of FIG. 4 are shown and described as executing serially, it is to be understood and appreciated that the present invention is not limited by the illustrated order, as some actions could in other examples occur in different orders and/or concurrently from that shown and described herein. Additionally, further qubits and couplers can be added to the serial execution so as to complete a logical qubit.

FIG. 4 illustrates a method 150 for constructing a quantum circuit. At 152, a first logical qubit is fabricated as a first Bacon-Shor code block. Accordingly, the first logical qubit includes at least a first physical qubit, a second physical qubit coupled to the first physical qubit along a first axis of the Bloch sphere, and a third physical qubit coupled to the first physical qubit along a second axis of the Bloch sphere. In one implementation, the first axis of the Bloch sphere is the X-axis and the second axis of the Bloch sphere is the Z-axis. At 154, a second logical qubit is fabricated as a second Bacon-Shor code block, comprising at least a fourth physical qubit, a fifth physical qubit coupled to the fourth physical qubit along the first axis of the Bloch sphere, and a sixth physical qubit coupled to the fourth physical qubit along the second axis of the Bloch sphere.

At 156, the first physical qubit is coupled to the fourth physical qubit along the first axis of the Bloch sphere with a first coupler. At 158, the third physical qubit is coupled to the sixth physical qubit along the first axis of the Bloch sphere with a first coupler. In one implementation, the coupling strengths of the first coupler and the second coupler are tunable via first and second classical controls. It will be appreciated that the tuning of each of the first coupling strength and the second coupling strength can be coordinated such that a strength of the coupling the first and second logical qubits along the first axis of the Bloch sphere is tunable. In one implementation, the first classical control applies a flux to the first coupler, and second classical control applies a flux to the second coupler to tune the coupling strengths of the couplers. It will be appreciated that, in practice, further connections can be made with additional qubits and couplers to complete a logical qubit.

It will be appreciated that the method can be extended to more complex systems. For example, a third logical qubit can be fabricated as a third Bacon-Shor code block, with at least a seventh physical qubit, an eighth physical qubit coupled to the seventh physical qubit along the first axis of the Bloch sphere, and a ninth physical qubit coupled to the seventh physical qubit along the second axis of the Bloch sphere. The third logical qubit can be edge coupled, as described herein, to either of the first and second logical qubits to extend the circuit, for example, to set up a more complex problem in a quantum annealing process. Accordingly, to set up a coupling of the third logical qubit with the first logical qubit along the second axis of the Bloch sphere, the first physical qubit would be coupled to the seventh physical qubit along the second axis of the Bloch sphere with a third coupler and the second physical qubit would be coupled to the eighth physical qubit along the second axis of the Bloch sphere with a fourth coupler. Similarly, to set up a coupling of the third logical qubit with the first logical qubit along the first axis of the Bloch sphere, the first physical qubit would be coupled to the seventh physical qubit along the first axis of the Bloch sphere with a third coupler and the third physical qubit would be coupled to the ninth physical qubit along the first axis of the Bloch sphere with a fourth coupler.

The layout of the circuit is also not limited to couplings to a central "hub" qubit, as in the example of FIGS. 1-3. For example, a fourth logical qubit can be coupled to the second or third logical qubits. One of ordinary skill in the art can appreciate extensions of the invention to arbitrary coupled arrays of logical qubits. The fourth logical qubit can be fabricated as a fourth Bacon-Shor code block, comprising at least a tenth physical qubit, an eleventh physical qubit coupled to the tenth physical qubit along the first axis of the Bloch sphere, and a twelfth physical qubit coupled to the tenth physical qubit along the second axis of the Bloch sphere. To couple the fourth logical qubit to the third logical qubit along the first axis of the Bloch sphere, the tenth physical qubit is coupled to the seventh physical qubit along the first axis of the Bloch sphere with a fifth coupler and the twelfth physical qubit is coupled to the ninth physical qubit along the first axis of the Bloch sphere with a sixth coupler. To couple the fourth logical qubit to the third logical qubit along the second axis of the Bloch sphere, the tenth physical qubit is coupled to the seventh physical qubit along the second axis of the Bloch sphere with a fifth coupler and the eleventh physical qubit is coupled to the eighth physical qubit along the second axis of the Bloch sphere with a sixth coupler.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A quantum circuit comprising:
    first and second logical qubits, each comprising a Bacon-Shor code block comprising a plurality of physical qubits coupled in an array, such that a first edge of each logical qubit contains physical qubits each coupled to at least one neighboring physical qubit along the first edge along a first axis of the Bloch sphere and a second edge of each logical qubit contains physical qubits each coupled to at least one neighboring physical qubit along the second edge along a second axis of the Bloch sphere; and
    a set of couplers that couple the first and second logical qubits along the first axis of the Bloch sphere, each of the set of couplers coupling a physical qubit along the second edge of the first logical qubit to a corresponding physical qubit along the second edge of the second logical qubit along the first axis of the Bloch sphere.

2. The quantum circuit of claim 1, wherein the set of couplers is a first set of couplers, the quantum circuit further comprising:
    a third logical qubit comprising a Bacon-Shor code block comprising a plurality of physical qubits coupled in an array, such that a first edge of the third logical qubit contains physical qubits each coupled to at least one neighboring physical qubit along the first edge along the first axis of the Bloch sphere and a second edge of the third logical qubit contains physical qubits each coupled to at least one neighboring physical qubit along the second edge along the second axis of the Bloch sphere; and
    a second set of couplers that couple the first and third logical qubits along the second axis of the Bloch sphere, each of the second set of couplers coupling a physical qubit along the first edge of the first logical qubit to a corresponding physical qubit along the first edge of the third logical qubit along the second axis of the Bloch sphere.

3. The quantum circuit of claim 1, wherein the first axis of the Bloch sphere is the X-axis and the second axis of the Bloch sphere is the Z-axis.

4. The quantum circuit of claim 1, wherein each of the set of couplers is tunable via a classical control, such that a strength of the coupling the first and second logical qubits along the first axis of the Bloch sphere is tunable.

5. The quantum circuit of claim 4, wherein a given classical control applies a flux to its associated coupler.

6. The quantum circuit of claim 1, wherein the set of couplers is a first set of couplers, the quantum circuit further comprising:
a third logical qubit comprising a Bacon-Shor code block comprising a plurality of physical qubits coupled in an array, such that a first edge of the third logical qubit contains physical qubits each coupled to at least one neighboring physical qubit along the first edge along the first axis of the Bloch sphere and a second edge of the third logical qubit contains physical qubits each coupled to at least one neighboring physical qubit along the second edge along the second axis of the Bloch sphere; and
a second set of couplers that couple the first and third logical qubits along the first axis of the Bloch sphere, each of the second set of couplers coupling a physical qubit along the second edge of the first logical qubit to a corresponding physical qubit along the second edge of the third logical qubit along the first axis of the Bloch sphere.

7. The quantum circuit of claim 6 further comprising:
a fourth logical qubit comprising a Bacon-Shor code block comprising a plurality of physical qubits coupled in an array, such that a first edge of the fourth logical qubit contains physical qubits each coupled to at least one neighboring physical qubit along the first edge along the first axis of the Bloch sphere and a second edge of the fourth logical qubit contains physical qubits each coupled to at least one neighboring physical qubit along the second edge along the second axis of the Bloch sphere; and
a third set of couplers that couple the second and fourth logical qubits along the first axis of the Bloch sphere, each of the second set of couplers coupling a physical qubit along the second edge of the second logical qubit to a corresponding physical qubit along the second edge of the fourth logical qubit along the first axis of the Bloch sphere.

8. The quantum circuit of claim 1, wherein the first axis of the Bloch sphere is the X-axis and the second axis of the Bloch sphere is the Y-axis.

9. A method for constructing a quantum circuit comprising:
fabricating a first logical qubit as a first Bacon-Shor code block, the first logical qubit comprising at least a first physical qubit, a second physical qubit coupled to the first physical qubit along a first axis of the Bloch sphere, and a third physical qubit coupled to the first physical qubit along a second axis of the Bloch sphere;
fabricating a second logical qubit as a second Bacon-Shor code block, the second logical qubit comprising at least a fourth physical qubit, a fifth physical qubit coupled to the fourth physical qubit along the first axis of the Bloch sphere, and a sixth physical qubit coupled to the fourth physical qubit along the second axis of the Bloch sphere;
coupling the first physical qubit to the fourth physical qubit along the first axis of the Bloch sphere with a first coupler; and
coupling the third physical qubit to the sixth physical qubit along the first axis of the Bloch sphere with a second coupler.

10. The method of claim 9, further comprising:
fabricating a third logical qubit as a third Bacon-Shor code block, the third logical qubit comprising at least a seventh physical qubit, an eighth physical qubit coupled to the seventh physical qubit along the first axis of the Bloch sphere, and a ninth physical qubit coupled to the seventh physical qubit along the second axis of the Bloch sphere;
coupling the first physical qubit to the seventh physical qubit along the second axis of the Bloch sphere with a third coupler; and
coupling the second physical qubit to the eighth physical qubit along the second axis of the Bloch sphere with a fourth coupler.

11. The method of claim 10, further comprising:
fabricating a fourth logical qubit as a fourth Bacon-Shor code block, the fourth logical qubit comprising at least a tenth physical qubit, an eleventh physical qubit coupled to the tenth physical qubit along the first axis of the Bloch sphere, and a twelfth physical qubit coupled to the tenth physical qubit along the second axis of the Bloch sphere;
coupling the tenth physical qubit to the seventh physical qubit along the first axis of the Bloch sphere with a fifth coupler; and
coupling the twelfth physical qubit to the ninth physical qubit along the first axis of the Bloch sphere with a sixth coupler.

12. The method of claim 11, wherein the first axis of the Bloch sphere is the Y-axis and the second axis of the Bloch sphere is the X-axis.

13. The method of claim 9, the first coupler having a first coupling strength and the second coupler having a second coupling strength and the method further comprising:
tuning the first coupling strength via a first classical control; and
tuning the second coupling strength via a second classical control, the tuning of each of the first coupling strength and the second coupling strength being coordinated such that a strength of the coupling the first and second logical qubits along the first axis of the Bloch sphere is tunable.

14. The method of claim 13, wherein the first classical control applies a flux to the first coupler, and second classical control applies a flux to the second coupler.

15. The method of claim 9, further comprising:
fabricating a third logical qubit as a third Bacon-Shor code block, the third logical qubit comprising at least a seventh physical qubit, an eighth physical qubit coupled to the seventh physical qubit along the first axis of the Bloch sphere, and a ninth physical qubit coupled to the seventh physical qubit along the second axis of the Bloch sphere;
coupling the first physical qubit to the seventh physical qubit along the first axis of the Bloch sphere with a third coupler; and
coupling the third physical qubit to the ninth physical qubit along the first axis of the Bloch sphere with a fourth coupler.

16. A quantum circuit comprising:
a first logical qubit comprising at least a first physical qubit, a second physical qubit coupled to the first physical qubit along a first axis of the Bloch sphere, and a third physical qubit coupled to the first physical qubit along a second axis of the Bloch sphere;
a second logical qubit comprising at least a fourth physical qubit, a fifth physical qubit coupled to the fourth physical qubit along the first axis of the Bloch sphere, and a sixth physical qubit coupled to the fourth physical qubit along the second axis of the Bloch sphere;
a third logical qubit comprising at least a seventh physical qubit, an eighth physical qubit coupled to the seventh physical qubit along the first axis of the Bloch sphere, and a ninth physical qubit coupled to the seventh physical qubit along the second axis of the Bloch sphere;
a first coupler that couples the first physical qubit to the fourth physical qubit along the first axis of the Bloch sphere;
a second coupler that couples the third physical qubit to the sixth physical qubit along the first axis of the Bloch sphere;
a third coupler that couples the first physical qubit to the seventh physical qubit along the second axis of the Bloch sphere; and
a fourth coupler that couples the second physical qubit to the eighth physical qubit along the second axis of the Bloch sphere.

17. The quantum circuit of claim 16, further comprising:
a fourth logical qubit comprising at least a tenth physical qubit, an eleventh physical qubit coupled to the tenth physical qubit along the first axis of the Bloch sphere, and a twelfth physical qubit coupled to the tenth physical qubit along the second axis of the Bloch sphere;
a fifth coupler that couples the fourth physical qubit to the tenth physical qubit along the second axis of the Bloch sphere; and
a sixth coupler that couples the fifth physical qubit to the eleventh physical qubit along the second axis of the Bloch sphere.

18. The quantum circuit of claim 16, wherein the first axis of the Bloch sphere is the Z-axis and the second axis of the Bloch sphere is the X-axis.

19. The quantum circuit of claim 16, wherein each of the first and second couplers is tunable via a classical control, such that a strength of the coupling the first and second logical qubits along the first axis of the Bloch sphere is tunable.

20. The quantum circuit of claim 19, wherein a given classical control applies a flux to its associated coupler.

* * * * *